(12) United States Patent
Kataoka et al.

(10) Patent No.: US 9,973,206 B2
(45) Date of Patent: May 15, 2018

(54) COMPUTER-READABLE RECORDING MEDIUM, ENCODING DEVICE, ENCODING METHOD, DECODING DEVICE, AND DECODING METHOD

(71) Applicant: FUJITSU LIMITED, Kawasaki-shi, Kanagawa (JP)

(72) Inventors: Masahiro Kataoka, Kamakura (JP); Fumiaki Nakamura, London (GB); Yasuhiro Suzuki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 15/471,171

(22) Filed: Mar. 28, 2017

(65) Prior Publication Data
US 2017/0288694 A1 Oct. 5, 2017

(30) Foreign Application Priority Data
Mar. 31, 2016 (JP) .................................. 2016-073314

(51) Int. Cl.
*H03M 7/34* (2006.01)
*H03M 7/30* (2006.01)
(52) U.S. Cl.
CPC ....... *H03M 7/3088* (2013.01); *H03M 7/3091* (2013.01); *H03M 7/6064* (2013.01)
(58) Field of Classification Search
CPC ........ H03M 7/40; H03M 7/30; H03M 7/3084; H03M 7/4006; H03M 7/425; H03M 7/6067; H03M 13/3761
USPC ............... 341/51, 65, 67, 106, 107
See application file for complete search history.

(56) References Cited

U.S. PATENT DOCUMENTS

| | | | | |
|---|---|---|---|---|
| 5,870,036 A * | 2/1999 | Franaszek | ........... | H03M 7/3086 341/51 |
| 5,872,530 A * | 2/1999 | Domyo | ............... | H03M 7/3088 341/106 |
| 6,771,824 B1* | 8/2004 | Chiu | ...................... | H03M 7/42 375/E7.144 |
| 6,985,965 B2* | 1/2006 | Hannu | ................... | H03M 7/30 709/247 |
| 7,882,263 B2* | 2/2011 | Pessi | ................... | H03M 7/3088 709/238 |
| 9,628,110 B2* | 4/2017 | Kataoka | ............... | H03M 7/3084 |
| 2005/0122240 A1* | 6/2005 | Kim | ........................ | H03M 7/40 341/65 |
| 2009/0149703 A1* | 6/2009 | Tanaka | ............... | A61B 1/00009 600/103 |

(Continued)

FOREIGN PATENT DOCUMENTS

JP 2000-269822 9/2000
WO WO 2014/097359 A1 6/2014

*Primary Examiner* — Lam T Mai
(74) *Attorney, Agent, or Firm* — Oblon, McClelland, Maier & Neustadt, L.L.P.

(57) ABSTRACT

An encoding device 100 encodes a plurality of input text files to a plurality of encoded files by using a static dictionary unit 121 and a dynamic dictionary unit 122. The dynamic dictionary unit 122 is generated in accordance with word appearance frequencies in the plurality of text files. The encoding device 100 generates a coupled encoded file that includes the plurality of encoded files, information on the dynamic dictionary unit 122, and position information that indicates positions of the respective plurality of encoded files.

14 Claims, 12 Drawing Sheets

(56) References Cited

U.S. PATENT DOCUMENTS

| | | | |
|---|---|---|---|
| 2013/0135123 A1* | 5/2013 | Golander | H03M 7/6076 |
| | | | 341/65 |
| 2016/0211863 A1* | 7/2016 | Kataoka | H03M 7/3084 |
| 2017/0019126 A1* | 1/2017 | Kataoka | G06F 17/30628 |
| 2017/0099064 A1* | 4/2017 | Kataoka | H03M 7/4037 |

* cited by examiner

FIG.11

Message Board: tramping a1

A-san
2015/07/14 at 17:54　　　　　a2
To Ozegahara.　　　　　　　　　　　a3
From Hatomachi-toge in Gunma Prefecture.
Expecting full-blown nikkokisuge and coolness······and it was fine and a summer day on 12th.
Kisuge was at beginning to bloom, and a few blossoms are coming out here and there.
But, better than.
We enjoyed it fully.
Watasuge and Hitsujigusa were in full bloom.
Snapped the back view of my friend.

Write a comment

Commnet List (9 comments)

B-san
2015/07/14 at 23:16
Good evening, A-san.　　　　　　　　　　　　　　　　　a1
It's nice to write to you.
The orange color of Nikkokisuge is pretty vivid···
The sky was deep blue and you might enjoyed an excellent tramping.
I hope you will show me again various blossoms in Ozegahara. Catch you later. Good night.
From Hokkaido

C-san
2015/07/15 at 07:47
Hello, A-san.
It's nice to write to you.
Good morning.
It was great for you to have such a nice weather.
(nikkokisuge)──────────────── a3
I'm cheered up by its color.

D-san
2015/07/15 at 08:20
Wow∼∼!!!! Beyond description∼∼∼!!

E-san
2015/07/15 at 12:45
It was great for you to have such a nice weather.
(Nikkokisuge) and the blue sky.
I'm so jealous.──────────── a3
Thank you for a freshening breeze in hot summer days.

F-san
2015/07/15 at 14:34
Very beautiful blue sky, cool looking green, and vivid yellow.
It's really nice.

G-san
2015/07/15 at 18:15　　　　　　 a1
A-san, it's nice to write to you.　　　　　　　　　　　　 a3
Ozegahara, the greatest weather, and blight yellow of nikkokisuge.
It seems to have been a hot summer day, but comfortable.
I hope I will be able to go to Ozegahara someday.

H-san
2015/07/15 at 22:14　　　　　 a1
Good evening. I miss Ozegahara.
(Nikkokisuge) is going to bloom beautiful.
It was great for you to have such a nice weather.──── a3
Didn't you mounted Hiuchigatake?
That was very difficult for me.
Because my stamina has already decreased, I always enjoy a village forest.

I-san
2015/07/16 at 15:56
This is the first time for me to write to you. I'll go to Oze on Aug. 4 and 5. I'm looking forward to it.

A-san
2015/07/16 at 17:15
　　　　　　　　　　　 a2
Hello, I-san.
Thank you for your comment.
I walked from Hatomachi-toge in Gunma Prefecture. It was one day trip of bus tour, and I have regrets about not having enough time. I-san will have a sleepover trip. Please enjoy Oze in summer.
Hiuchigatake is in the first photo. I hope you will have a safe trip.

COMPUTER-READABLE RECORDING MEDIUM, ENCODING DEVICE, ENCODING METHOD, DECODING DEVICE, AND DECODING METHOD

CROSS-REFERENCE TO RELATED APPLICATION(S)

This application is based upon and claims the benefit of priority of the prior Japanese Patent Application No. 2016-073314, filed on Mar. 31, 2016, the entire contents of which are incorporated herein by reference.

FIELD

The embodiment discussed herein is related to a computer-readable recording medium, an encoding device, an encoding method, a decoding device, and a decoding method.

BACKGROUND

The compression technologies include the LZ77-based compression such as ZIP and the LZ78-based compression such as LZW as major technology. The LZ77-based compression executes a longest match character string search for a character string to be compressed by using a slide window, and assigns, to a compression code, the address and character string length of the longest matched character string.

As one example, the LZ78-based compression technology compresses words in original document data by using a static word dictionary in which normally-used words and phrases are preliminary registered in a hierarchical structure (trie structure), and an auxiliary dictionary in which character strings in the original document data that are not registered in the static word dictionary are registered (for example, see Japanese Laid-open Patent Publication No. 2000-269822).

However, there exists a problem in the conventional compression technology that a compression ratio is not improved in a case where a plurality of files exists in document data to be compressed.

For example, the LZ77-based compression technology executes compression on the basis of repeated byte patterns by using a slide window. In a case where a plurality of files exists in document data to be compressed, this slide window is not shared between the files. This is because a byte pattern that repeatedly appears in a specific file does not always similarly appear in another file. Therefore, in a case where a plurality of files exists in document data to be compressed, the LZ77-based compression technology individually executes compression for each of the files, and thus a compression ratio is not improved.

As one example, in a case where a plurality of files exists in document data to be compressed, the LZ78-based compression technology registers, for each of the files, words in an auxiliary dictionary, which are not registered in the static word dictionary, and executes encoding by using the registered auxiliary dictionary and the trie structure. When the number of the auxiliary dictionaries increases, the size of the dictionary also increases. When repeatedly-appearing words are registered in the auxiliary dictionary of each of the files, the size of the dictionary increases. Therefore, even in case of the LZ78-based compression, a compression ratio is not improved in a case where a plurality of files exists in document data to be compressed.

SUMMARY

According to an aspect of an embodiment, a non-transitory computer-readable recording medium has stored therein an encoding program. The encoding program causes a computer to execute a process. The process includes encoding a plurality of input text files to a plurality of encoded files by using a static dictionary and a dynamic dictionary, the dynamic dictionary being generated in accordance with word appearance frequencies in the plurality of text files. The process includes generating a coupled encoded file that includes the plurality of encoded files, information on the dynamic dictionary, and position information that indicates positions of the respective plurality of encoded files.

According to another aspect of an embodiment, a non-transitory computer-readable recording medium has stored therein a decoding program. The decoding program causes a computer to execute a process. The process includes extracting an encoded file to be decoded from a coupled encoded file, which includes a plurality of encoded files, information on a dynamic dictionary generated in accordance with word appearance frequencies, and position information indicating positions of the respective plurality of encoded files, based on the position information that indicates the positions of the respective plurality of encoded files. The process includes decoding the extracted encoded file by using the dynamic dictionary and a static dictionary.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 11 is a diagram illustrating one example of a use of the encoding process according to the present embodiment;

DESCRIPTION OF EMBODIMENT

Preferred embodiments of the present invention will be explained with reference to accompanying drawings. In addition, the disclosed technology is not limited to the embodiment described below.

Encoding Process According to Embodiment

Figure 1:
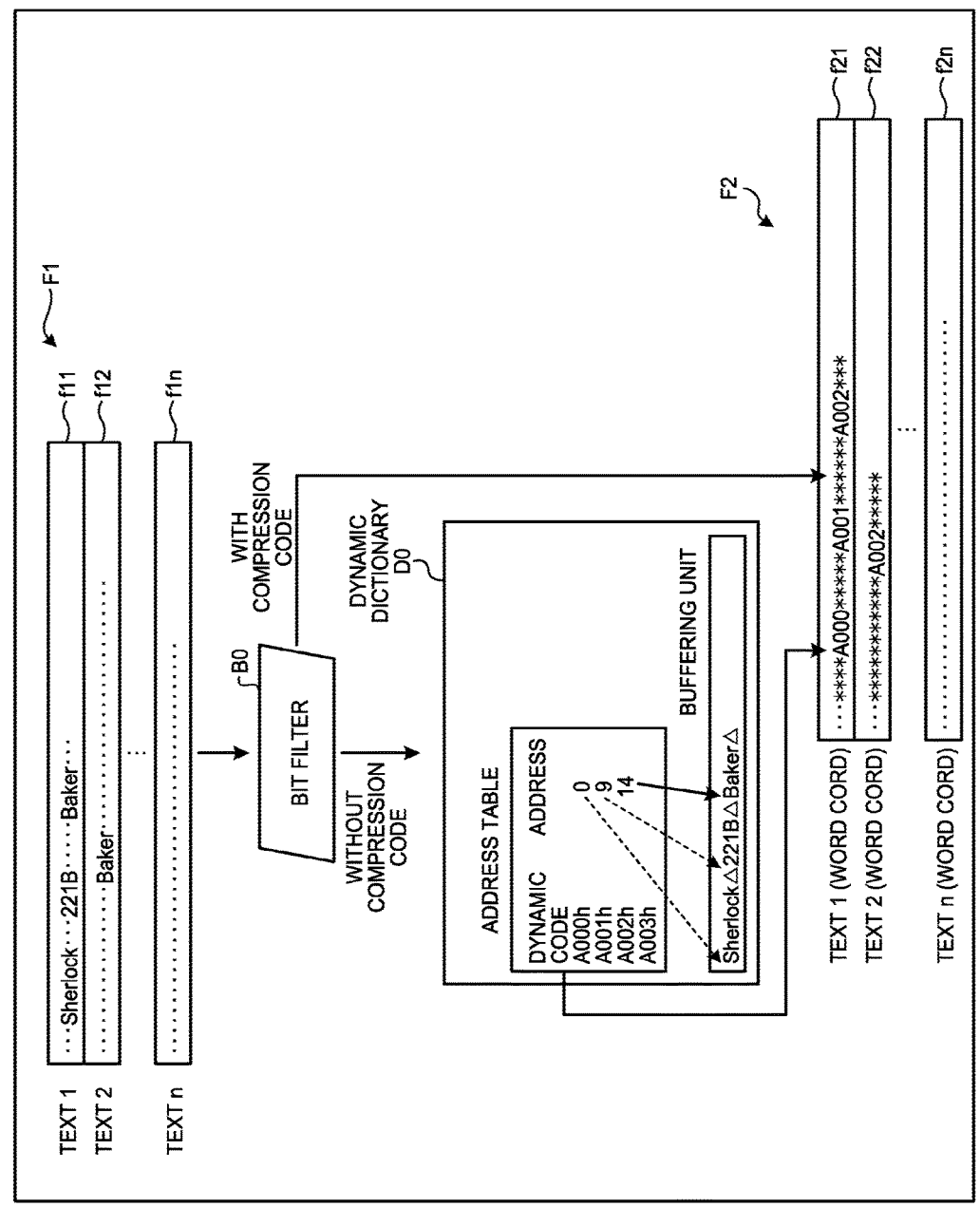
FIG. 1 is a diagram illustrating one example of a flow of an encoding process to be executed by an encoding device according to a present embodiment.

FIG. 1 is a diagram illustrating one example of a flow of an encoding process to be executed by an encoding device according to the present embodiment. As illustrated in FIG. 1, the encoding device encodes a plurality of text files f11 to f1n in a file F1 to be encoded by using a static dictionary and a dynamic dictionary D0. The encoding device causes the dynamic dictionary D0, in which repeatedly-appearing words in the plurality of text files f11 to f1n are registered, to be shared therebetween so as to improve a compression ratio.

Herein, first, a static dictionary is a dictionary in which a shorter code is assigned to a word of the higher appearance frequency by specifying the word appearance frequencies in a document on the basis of a general English-language dictionary, a Japanese-language dictionary, a textbook, etc. Static codes that are codes corresponding to respective words are preliminary registered in the static dictionary. On the other hand, the dynamic dictionary D0 is a dictionary in which a word not registered in the static dictionary is associated with a dynamic code that is dynamically provided. The word not registered in the static dictionary is, as an example, a word of the low appearance frequency (low frequency word), an unknown word, a value, a time, a tag, etc. The unknown word mentioned here is a word not registered in the static dictionary, and a word that has a feature of repeatedly appearing in a document to be encoded. Words associated with the dynamic codes are registered in a buffering unit of the dynamic dictionary D0 in the order of the appearance of the words not registered in the static dictionary. The detailed explanation of the dynamic dictionary D0 will be mentioned later.

Hereinafter, one example of an encoding process of the encoding device will be explained. For example, the encoding device loads the plurality of text files f11 to f1n in the file F1 to be encoded into a memory region. The text files f11 to f1n mentioned here are files associated with each other. The files associated with each other are files including a common specific word, or files in which the appearance frequency of a specific word is more than a predetermined value. Or, the files are files in the same folder, or files having common or associated file-related information.

The encoding device reads a text file to be encoded from the memory region, and executes lexical analysis on the read text file. The lexical analysis mentioned here corresponds to dividing the text file in a non-encoded state into words.

The encoding device compares a character string of the word with a bit filter B0, and determines whether or not the character string of word is hit in the bit filter B0. The bit filter B0 is a filter that specifies an encodable character string of word by using the static dictionary. One example of a data configuration of the bit filter B0 will be mentioned later. In a case where the character string of word is hit in the bit filter B0, the encoding device encodes the character string of word into a static code corresponding to the character string of word on the basis of the static dictionary, and outputs the static code.

In a case where the character string of word is not hit in the bit filter B0, the encoding device determines whether or not the character string of word is registered in the dynamic dictionary D0. In a case where the character string of word is not registered in the dynamic dictionary D0, the encoding device registers the character string of word in the dynamic dictionary D0, encodes the registered character string of word into a dynamic code corresponding to the registered character string of word on the basis of the dynamic dictionary D0, and outputs the dynamic code. In a case where the character string of word is registered in the dynamic dictionary D0, the encoding device encodes the character string of word into a dynamic code corresponding to the character string of word on the basis of the dynamic dictionary D0.

The encoding device outputs the static code based on the bit filter B0 and the dynamic code based on the dynamic dictionary D0 to a text (word code) area, in an encoded file F2, corresponding to the text file to be encoded.

Herein, the process in a case where the encoding device encodes the text file f11 in the file F1 to be encoded will be explained. The text file f11 stores " . . . Sherlock . . . 221B . . . Baker . . . ". A character string of word "Sherlock", a character string of word "221B", and a character string of word "Baker" are assumed not to be registered in the static dictionary. The character strings of words are assumed not to be registered in the dynamic dictionary D0.

The encoding device determines whether or not the character string of word "Sherlock" is hit in the bit filter B0. The encoding device determines whether or not the character string of word "Sherlock" is already registered in the dynamic dictionary D0, because the character string of word "Sherlock" is not hit in the bit filter B0. The encoding device registers the character string of word "Sherlock" in the dynamic dictionary D0 in association with a new dynamic code "A000h", because the character string of word "Sherlock" is not already registered in the dynamic dictionary D0. The encoding device outputs the dynamic code "A000h" to a text file (word code) f21 in the encoded file F2 corresponding to the text file f11.

The encoding device determines whether or not the character string of word "221B" is hit in the bit filter B0. The encoding device determines whether or not the character string of word "221B" is already registered in the dynamic dictionary D0, because the character string of word "221B" is not hit in the bit filter B0. The encoding device registers the character string of word "221B" in the dynamic dictionary D0 in association with a new dynamic code "A001h", because the character string of word "221B" is not already registered in the dynamic dictionary D0. The encoding device outputs the dynamic code "A001h" to a text file (word code) f21 of the encoded file F2 corresponding to the text file f11.

The encoding device determines whether or not the character string of word "Baker" is hit in the bit filter B0. The encoding device determines whether or not the character string of word "Baker" is already registered in the dynamic dictionary D0, because the character string of word "Baker" is not hit in the bit filter B0. The encoding device registers the character string of word "Baker" in the dynamic dictionary D0 in association with a new dynamic code "A002h", because the character string of word "Baker" is not already registered in the dynamic dictionary D0. The encoding device outputs the dynamic code "A002h" to a text file (word code) f21 of the encoded file F2 corresponding to the text file f11.

Subsequently, the process in a case where the encoding device encodes the text file f12 stored in the file F1 to be encoded will be explained. The text file f12 stores " . . . Baker . . . ". The character string of word "Baker" is registered in the dynamic dictionary D0.

The encoding device determines whether or not the character string of word "Baker" is hit in the bit filter B0. The encoding device determines whether or not the character string of word "Baker" is already registered in the dynamic dictionary D0, because the character string of word "Baker" is not hit in the bit filter B0. The encoding device encodes the character string of word "Baker" into the dynamic code "A002h" corresponding to the character string of word on the basis of the dynamic dictionary D0, because the character string of word "Baker" is already registered in the dynamic dictionary D0. The encoding device outputs the dynamic code "A002h" to a text file (word code) f22 of the encoded file F2 corresponding to the text file f12.

Thus, the encoding device causes the dynamic dictionary D0 in which a repeatedly-appearing word is registered to be shared between the plurality of text files f11 to f1n so as to improve a compression ratio. In other words, the encoding device has the dynamic dictionary D0 that is shared between the text files f11 to f1n, so that it is possible to improve a compression ratio compared with the case in which the encoding device has dynamic dictionaries in the respective text files f11 to f1n.

One Example of Dynamic Dictionary

Figure 2:
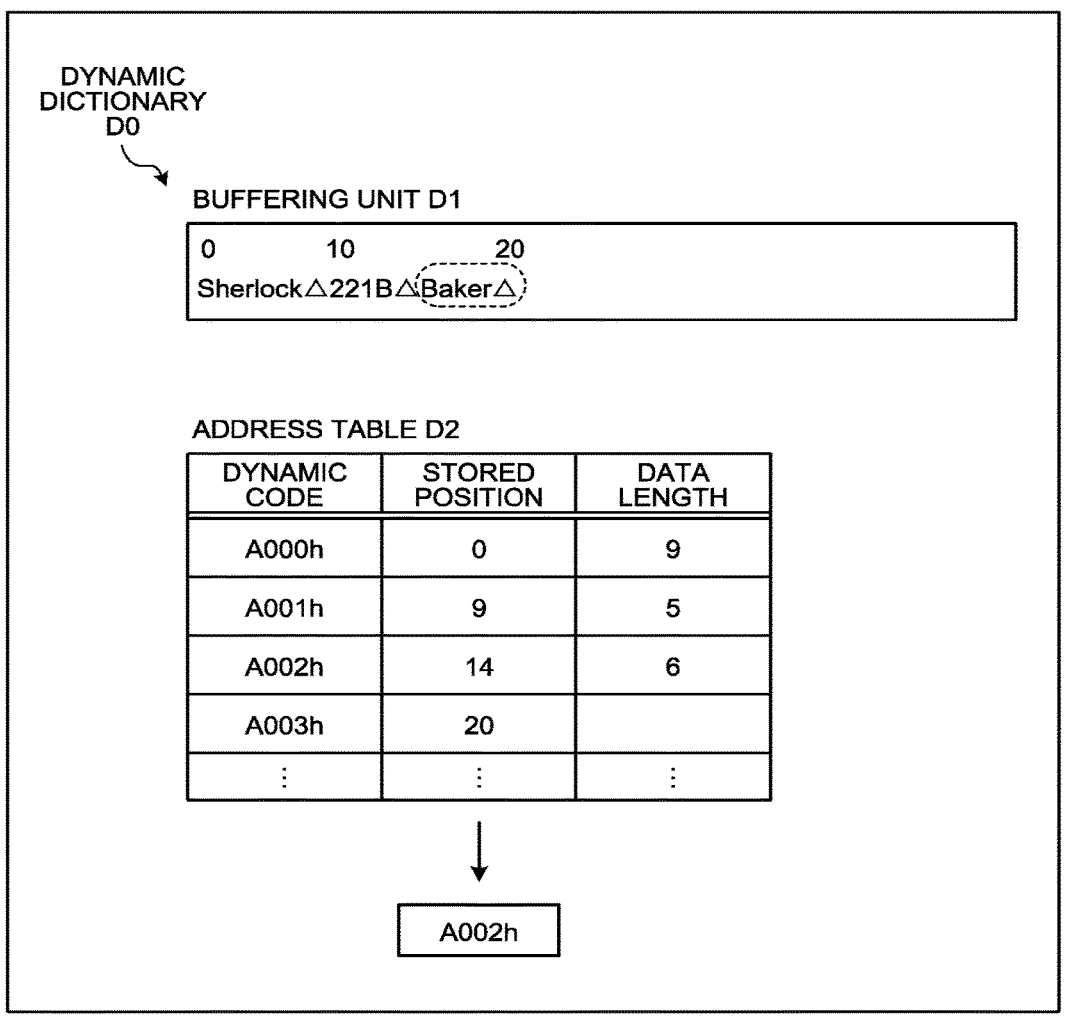
FIG. 2 is a diagram illustrating one example of a dynamic dictionary according to the present embodiment.

FIG. 2 is a diagram illustrating one example of the dynamic dictionary according to the present embodiment. The dynamic dictionary D0 illustrated in FIG. 2 includes a buffering unit D1 and an address table D2. The buffering unit D1 stores a character string. The address table D2 holds a dynamic code, a stored position, and the data length in association with each other. The dynamic code is a code of the predetermined fixed length, and is, for example, a compression code. The dynamic codes are assigned in the order of the registration of the character strings of words. Herein, the dynamic code is a double-byte code of fixed-length, which is starting from "A" in hexadecimal. The stored position indicates the position of a character string stored in the buffering unit D1. The data length indicates the length (byte length) of a character string stored in the buffering unit D1.

For example, the case in which a dynamic code is assigned to the character string "Baker" will be explained.

The encoding device stores the character string "Baker" in the buffering unit D1. The encoding device registers the stored position where the character string is stored and the length of the stored data in the address table D2. Herein, the encoding device registers "14" as the stored position and "6" as the data length in the address table D2.

The encoding device assigns a dynamic code of the address table D2, which is associated with the character string, as a compression code. Herein, the encoding device assigns the dynamic code "A002h" that is associated with the character string "Baker".

One Example of Bit Filter

Figure 3:
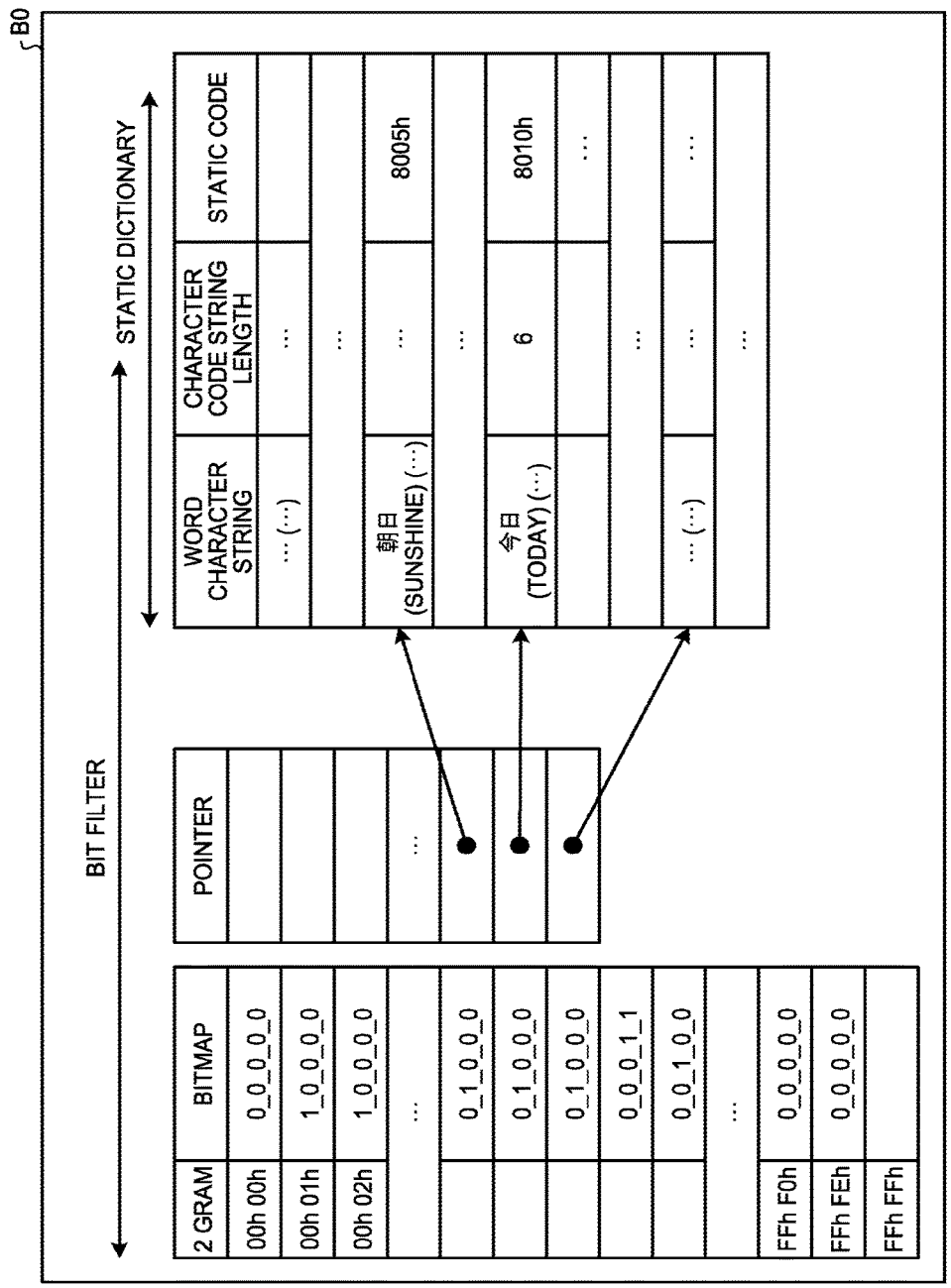
FIG. 3 is a diagram illustrating one example of a bit filter.

FIG. 3 is a diagram illustrating one example of the bit filter. The bit filter B0 illustrated in FIG. 3 is a bit filter of general Japanese words in a predetermined document. In FIG. 3, the bit filter of general Japanese words is exemplified. However, because a configuration of the bit filter of basic words including alphanumeric characters is similar thereto, the explanation thereof is omitted.

As illustrated in FIG. 3, the bit filter B0 includes a 2 gram, a bitmap, a pointer, a word character string, a character code string length, and a static code in association with each other.

The 2 gram is information that indicates a character code string of two characters. The bitmap indicates a bitmap corresponding to the character code string of the 2 gram. For example, the bitmap corresponding to "00h00h" is "0_0_0_0_0". The pointer is a pointer that indicates the position of a word character string corresponding to the bitmap.

The word character string is the character string of a Japanese word, which is registered in a static dictionary, and is expressed by a character code string. Herein, the character code string is illustrated in parentheses. The character code string length is the length of the character code string corresponding to the word character string. The static code is, for example, a compression code, which is assigned to a word character string.

For example, the case in which a static code is assigned to a word character string "今日 (today)" will be explained. The encoding device compares the word character string "今日 (today)" with the bit filter B0, and specifies a static code "8010h" registered in the static dictionary, which is hit by "今日 (today)" in the bit filter B0.

Configuration Example of Encoding File

Figure 4:
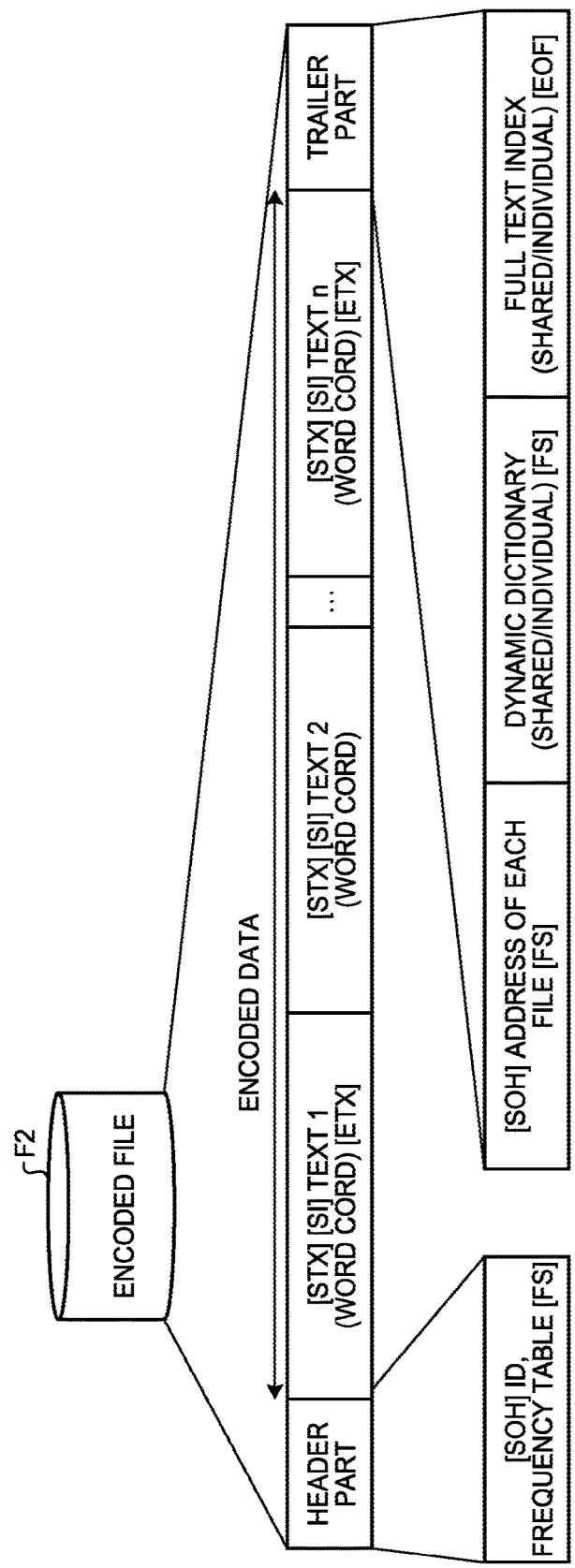
FIG. 4 is a diagram illustrating a configuration example of an encoded file.

FIG. 4 is a diagram illustrating a configuration example of an encoded file. As illustrated in FIG. 4, the encoded file F2 includes a header part, encoded data, and a trailer part. The encoded data stores a group of encoded word codes of the respective plurality of text files. The trailer part stores addresses of files, information on the dynamic dictionary D0, a tree for decoding, etc. The addresses of files indicate addresses where the encoded files of the plurality of text files are stored. For example, the address of each of the files is a relative address from the head of the encoded data. Information on the dynamic dictionary D0 corresponds to information on the dynamic dictionary illustrated in FIG. 2. A pointer to an address of each of the files and a pointer to the dynamic dictionary D0 stored in a trailer part are stored in the header part. The encoding device encodes the plurality of text files, and then stores each file that is the encoded result in the encoded file F2, and stores the stored addresses in an address of each file. In a decoding process, the decoding device to be mentioned later refers to an address of a file to be decoded from the address of each of the files in a trailer part by using a pointer to an address of each of the files in a header part. The decoding device refers to the dynamic dictionary D0 by using the pointer to the dynamic dictionary D0 in a header part.

Flow of Decoding Process

Figure 5:
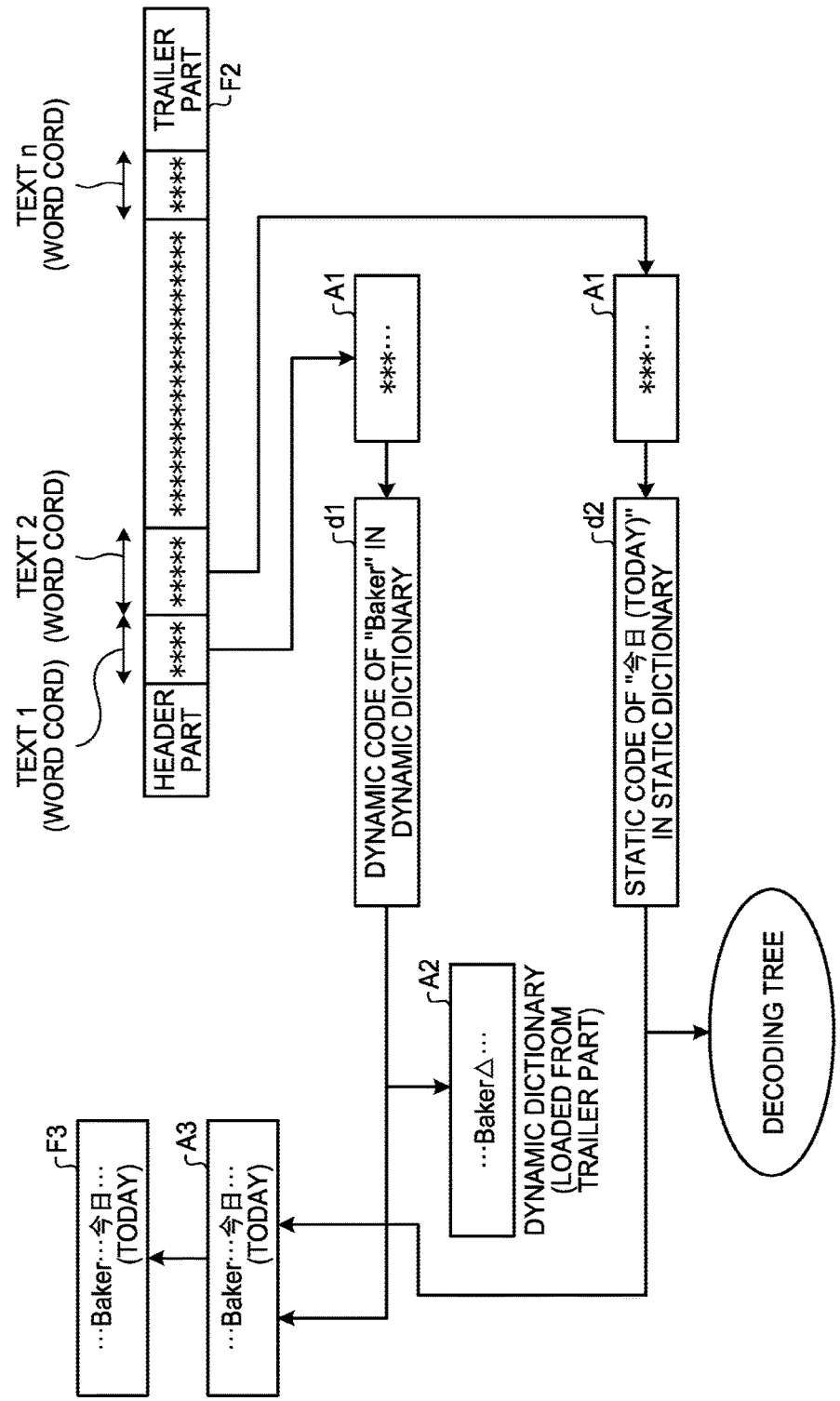
FIG. 5 is a diagram illustrating one example of a flow of a decoding process to be executed by a decoding device according to the present embodiment.

FIG. 5 is a diagram illustrating one example of a flow of a decoding process to be executed by a decoding device according to the present embodiment. In FIG. 5, memory regions A1, A2, and A3 are provided in a memory as work areas of the decoding process. The decoding device loads information on the dynamic dictionary D0 stored in the trailer part illustrated in FIG. 4 into the memory region A2. The decoding device loads encoded data of the text file f12 stored in the encoded file F2 into the memory region A1, and sequentially reads out word codes. The decoding device executes a decoding process in accordance with the read out word codes. The decoding device stores the character string of word (character code) in the memory region A3, and generates a decoded file F3 on the basis of character codes stored in the memory region A3.

In FIG. 5, the decoding process executed on word codes d1 and d2 will be explained.

The decoding device reads out encoded data for the text file f12, and determines whether or not a word code included in the encoded data is a dynamic code. In the example illustrated in FIG. 5, the word code d1 is determined to be a dynamic code. Thereby, the decoding device decodes the word code d1 by using the dynamic dictionary D0. For example, the decoding device specifies a dynamic code that coincides with the word code d1 from the address table D2 in the dynamic dictionary D0, and acquires the stored position and the data length corresponding to the specified dynamic code. The decoding device specifies decoded data indicating the acquired stored position and data length from the buffering unit D1. In other words, the decoding device specifies the character string of word (character code). Herein, the character string of word (character code) "Baker" is specified as the decoded data. The decoding device writes the specified decoded data into the memory region A3.

The decoding device reads out encoded data for the text file f12, and determines whether or not a word code included in the encoded data is a dynamic code. In the example illustrated in FIG. 5, the word code d2 is determined not to be a dynamic code. In other words, the word code d2 is determined to be encoded by using the static dictionary. Thereby, the decoding device elongates the word code d2 by using a decoding tree. For example, the decoding device compares the word code d2 with the decoding tree, and specifies a pointer to decoded data indicated in the decoding tree. The decoding device specifies the decoded data on the basis of the specified pointer to the decoded data. Herein, the character string of word (character code) "今日 (today)" is specified as the decoded data. The decoding device writes the specified decoded data into the memory region A3.

The decoding device decodes all of the encoded data for the text file f12, and then writes the decoded data that is written into the memory region A3 into the decoded file F3.

Thus, the decoding device can individually decode encoded data for each of the text files by using the shared dynamic dictionary D0.

Figure 6:
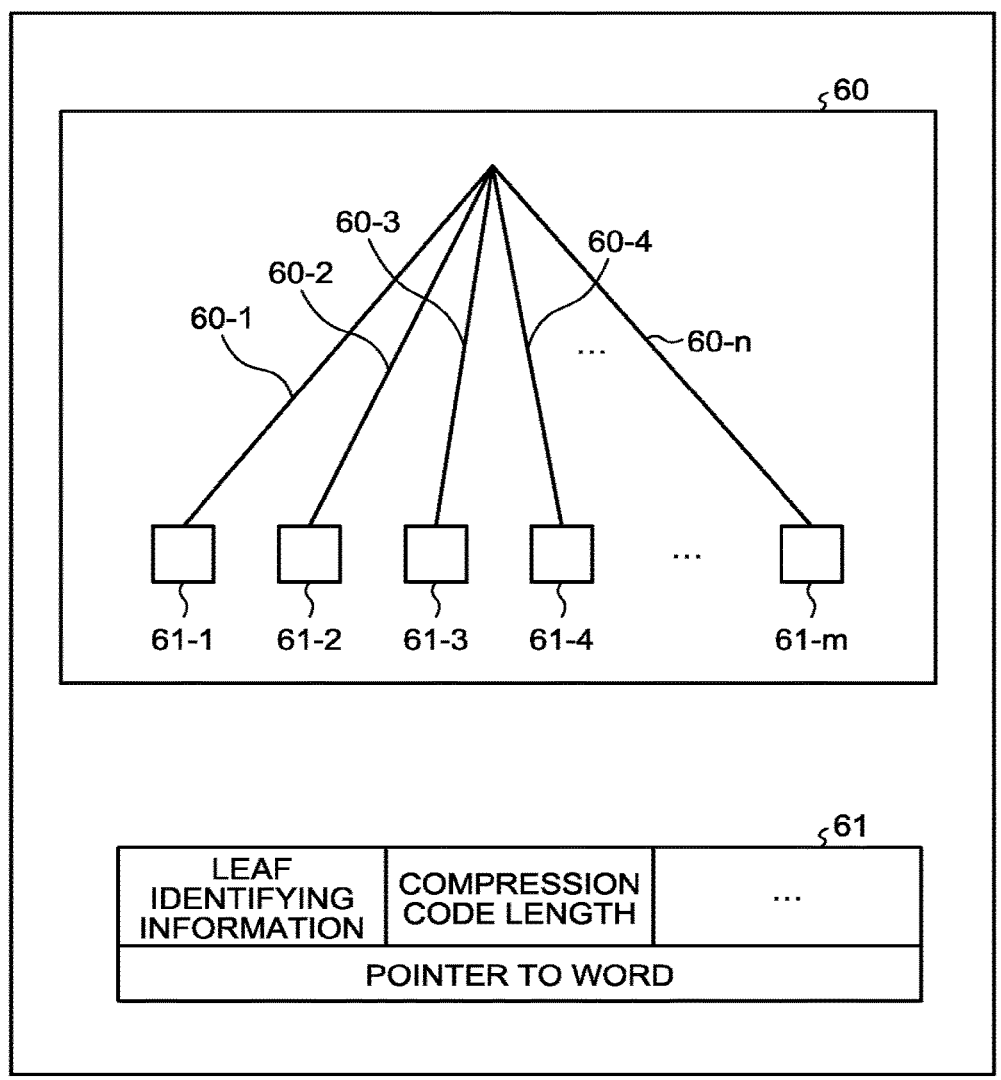
FIG. 6 is a diagram illustrating one example of a data configuration of a tree for decoding.

FIG. 6 is a diagram illustrating one example of a data configuration of the tree for decoding. As illustrated in FIG. 6, a tree 60 for decoding includes a plurality of branches 60-1 to 60-n and a plurality of leaves 61-1 to 61-m. Predetermined bit strings are assigned to the branches 60-1 to 60-n, respectively. The decoding device compares a bit string of word code with the bit strings assigned to branches 60-1 to 60-n, and specifies a leaf connected to the branch that hits to the bit string of word code. Information on characters and the like corresponding to a word code is stored in the leaf.

For example, the data configuration of the leaf is the configuration referred by a reference symbol 61. For example, leaf identifying information, the compression code length, and a pointer to a word are stored in the leaf. The leaf identifying information is information that uniquely identifies a leaf. The compression code length is information that indicates the effective length of a bit string of word code compared with the branches 60-1 to 60-n. The pointer to a word is information that uniquely indicates decoded data in a case where a word code is decoded, and corresponds to a pointer to decoded data.

Configuration of Encoding Device

Figure 7:
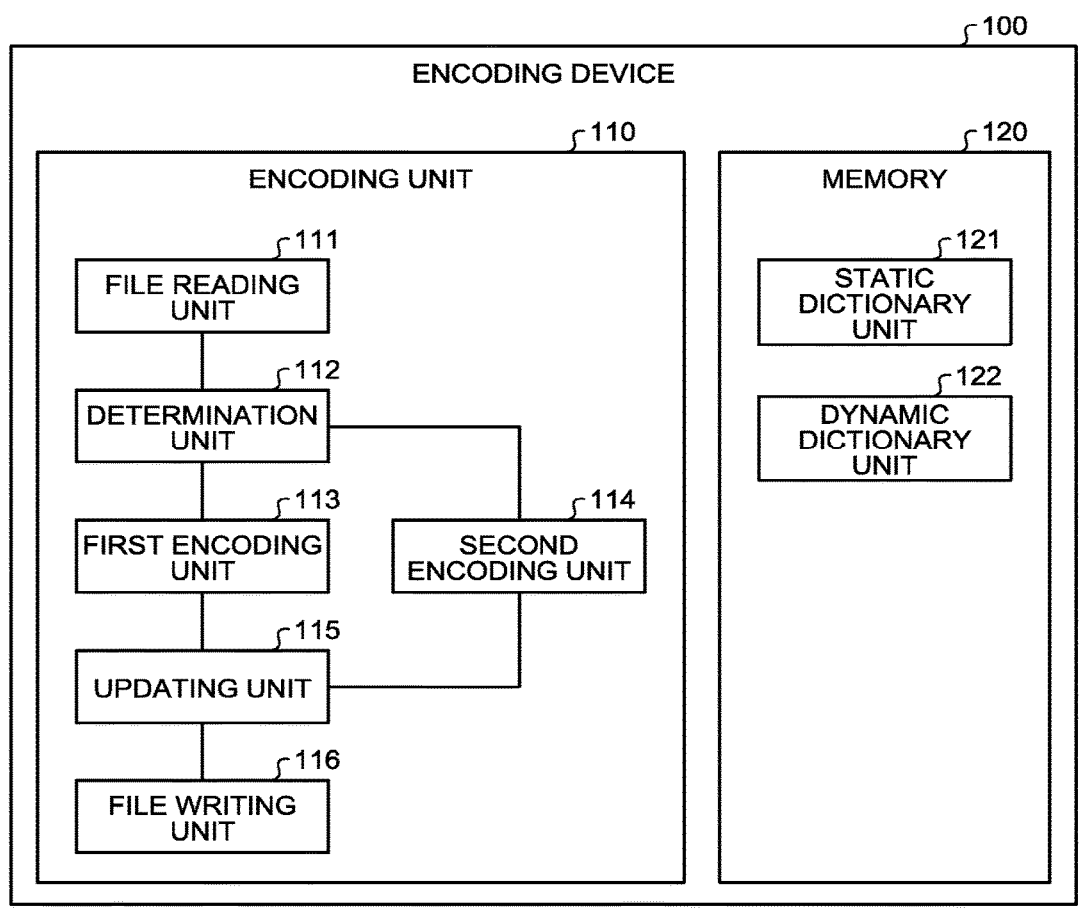
FIG. 7 is a functional block diagram illustrating a configuration example of the encoding device according to the present embodiment.

FIG. 7 is a functional block diagram illustrating a configuration example of the encoding device according to the present embodiment. As illustrated in FIG. 7, an encoding device 100 includes an encoding unit 110 and a memory 120.

The encoding unit 110 is a processing unit that executes the encoding process illustrated in FIG. 1. The encoding unit 110 includes a file reading unit 111, a determination unit 112, a first encoding unit 113, a second encoding unit 114, an updating unit 115, and a file writing unit 116.

The memory 120 corresponds to a memory device of, for example, a non-volatile semiconductor memory element such as a Flash memory and a Ferroelectric Random Access Memory (FRAM: Registered Trademark). The memory 120 includes a static dictionary unit 121 and a dynamic dictionary unit 122.

The static dictionary unit 121 is a dictionary in which the word appearance frequencies in a document is specified on the basis of a general English-language dictionary, a Japanese-language dictionary, a textbook, etc., and a shorter code is assigned to a word of higher appearance frequency. The explanation of the static dictionary unit 121 is similar to that of FIG. 3, and thus the explanation thereof is omitted.

The dynamic dictionary unit 122 is a dictionary in which a word not registered in the static dictionary unit 121 and a dynamic code (word code) that is dynamically provided are associated with each other. The explanation of the dynamic dictionary unit 122 is similar to that of FIG. 2, and thus the explanation thereof is omitted.

The file reading unit 111 reads out a plurality of text files in the file F1 to be encoded into the memory region. The file reading unit 111 reads out a text file to be encoded from the memory region, and executes lexical analysis on the read out text file. The file reading unit 111 sequentially outputs words that are the results of the lexical analysis to the determination unit 112.

The determination unit 112 determines whether or not the word is registered in the static dictionary unit 121. For example, the determination unit 112 determines whether or not the character string of word output from the file reading unit 111 is hit in the bit filter B0 of the static dictionary unit 121. When determining that the character string of word is hit in the bit filter B0 of the static dictionary unit 121, the determination unit 112 outputs the character string of word to the first encoding unit 113. When determining that the character string of word is not hit in the bit filter B0 of the static dictionary unit 121, the determination unit 112 outputs the character string of word to the second encoding unit 114.

The first encoding unit 113 encodes the character string of word on the basis of the static dictionary unit 121. For example, the first encoding unit 113 encodes the character string of word into a static code corresponding to the character string of word on the basis of a static dictionary of the static dictionary unit 121. The first encoding unit 113 outputs the encoded static code to the updating unit 115.

The second encoding unit 114 encodes the character string of word on the basis of the dynamic dictionary unit 122. For example, the second encoding unit 114 determines whether or not the character string of word is already stored in the buffering unit D1 of the dynamic dictionary unit 122. In a case where the character string of word is not already stored in the buffering unit D1 of the dynamic dictionary unit 122, the second encoding unit 114 stores the character string of word in the buffering unit D1, and further stores a stored position where the character string of word is stored and the length of the stored data in the address table D2. The second encoding unit 114 encodes the character string of word into a dynamic code of the address table D2, which are associated with the character string of word. In a case where the character string of word is already stored in the buffering unit D1 of the dynamic dictionary unit 122, the second encoding unit 114 encodes the character string of word into a dynamic code corresponding to the character string of word. The second encoding unit 114 outputs the encoded dynamic code to the updating unit 115.

The updating unit 115 acquires encoded data from the first encoding unit 113 and the second encoding unit 114, and accumulates the acquired encoded data in a memory region in the order of the acquisition to update the memory region.

The file writing unit 116 encodes all of the plurality of text files in the file F1, and then stores the encoded data (word code) having written into the memory region in the encoded file F2. The file writing unit 116 writes the information on the dynamic dictionary unit 122 and the addresses where the files being encoded results of the text files are stored into a trailer part of the encoded file F2.

Configuration of Decoding Device

Figure 8:
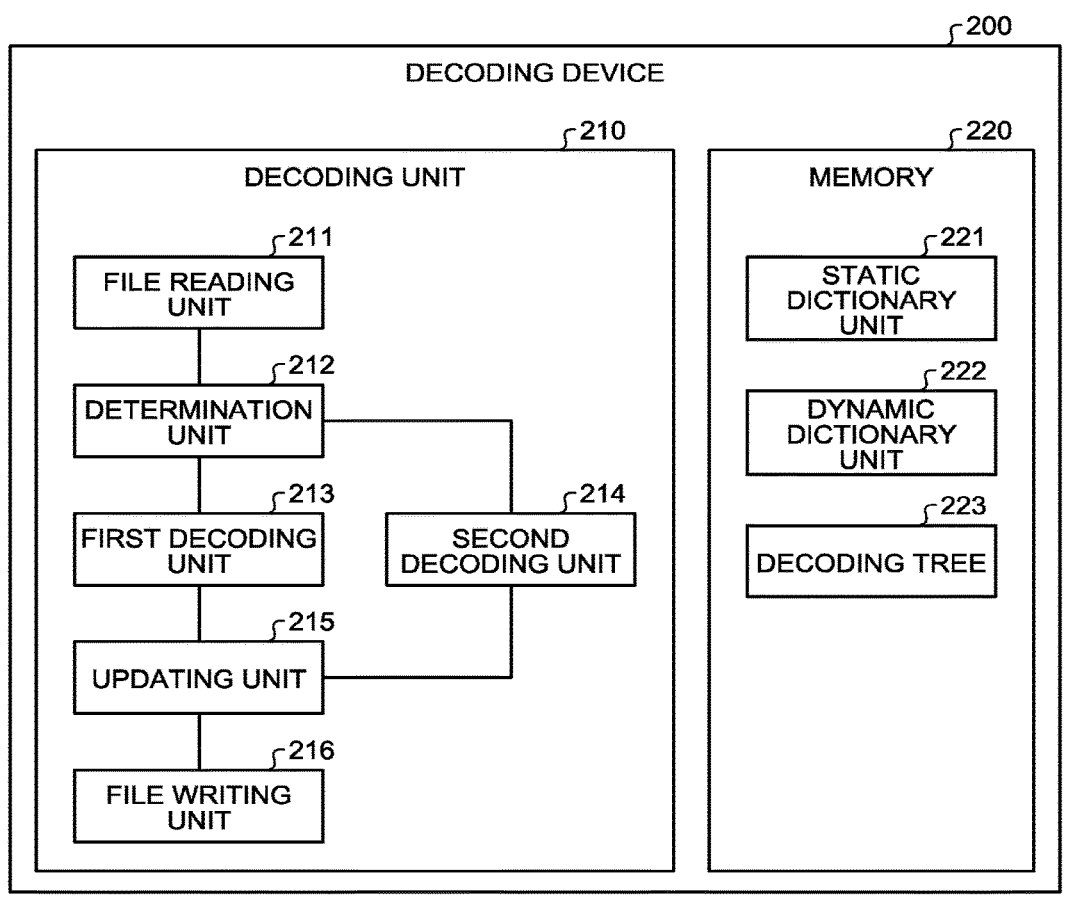
FIG. 8 is a functional block diagram illustrating a configuration example of the decoding device according to the present embodiment.

FIG. 8 is a functional block diagram illustrating a configuration example of the decoding device according to the present embodiment. As illustrated in FIG. 8, a decoding device 200 includes a decoding unit 210 and a memory 220.

The decoding unit 210 is a processing unit that executes the decoding process illustrated in FIG. 5. The decoding unit 210 includes a file reading unit 211, a determination unit 212, a first decoding unit 213, a second decoding unit 214, an updating unit 215, and a file writing unit 216.

The memory 220 corresponds to a memory device of, for example, a non-volatile semiconductor memory element such as a Flash memory and a Ferroelectric Random Access Memory (FRAM: Registered Trademark). The memory 220 includes a static dictionary unit 221, a dynamic dictionary unit 222, and a decoding tree 223.

The static dictionary unit 221 is a dictionary in which the word appearance frequencies in a document are specified on the basis of a general English-language dictionary, a Japanese-language dictionary, a textbook, etc., and a shorter code is assigned to a word of the higher appearance frequency. The explanation of the static dictionary unit 221 is similar to that of FIG. 3, and thus the explanation thereof is omitted.

The dynamic dictionary unit 222 is a dictionary in which a word not registered in the static dictionary unit 221 and a dynamic code (word code) that is dynamically provided are associated with each other. The explanation of the dynamic dictionary unit 222 is similar to that of FIG. 2, and thus the explanation thereof is omitted.

The decoding tree 223 is a tree that is used at decoding of a static code of a word registered in the static dictionary unit 221. The explanation of the decoding tree 223 is similar to that of FIG. 6, and thus the explanation thereof is omitted.

The file reading unit 211 reads out encoded data of the text file to be decoded in the encoded file F2 into the memory region A1. For example, the file reading unit 211 reads out encoded data of the text file to be decoded into the memory region A1 by using the address of each of the files stored in a trailer part of the encoded file F2. The file reading unit 211 sequentially outputs the word codes to the determination unit 212 from the head of the memory region A1.

The determination unit 212 determines whether or not the word code is a dynamic code. For example, the determination unit 212 determines whether or not the headmost four bits of the word code is "A". In a case where the headmost four bits of the word code is "A", the determination unit 212 determines that the word code is a dynamic code. The determination unit 212 outputs the dynamic code to the second decoding unit 214. In a case where the headmost four bits of the word code is not "A" the determination unit 212 determines that the word code is not a dynamic code, in other words, is a static code. The determination unit 212 outputs the static code to the first decoding unit 213.

The first decoding unit 213 decodes the static code by using the decoding tree 223. For example, the first decoding unit 213 compares the static code with the decoding tree 223 to specify a pointer to decoded data indicated in the decoding tree 223. The first decoding unit 213 specifies the decoded data on the basis of the pointer to the specified decoded data. The first decoding unit 213 outputs the specified decoded data to the updating unit 215.

The second decoding unit 214 decodes the encoded data by using the dynamic dictionary unit 222. For example, the second decoding unit 214 specifies a dynamic code that coincides with the word code from the address table D2 of the dynamic dictionary unit 222, and acquires the stored position and the data length corresponding to the specified dynamic code. The second decoding unit 214 specifies decoded data of the acquired stored position and the data length from the buffering unit D1 of the dynamic dictionary unit 222. The second decoding unit 214 outputs the specified decoded data to the updating unit 215.

The updating unit 215 acquires the decoded data from the first decoding unit 213 and the second decoding unit 214, and accumulates the acquired decoded data in the memory region A3 in the order of the acquisition to update the memory region.

The file writing unit 216 decodes all of the encoded data of the text file to be decoded in the encoded file F2 and then writes the written decoded data in the memory region into the decoded file F3.

Processing Procedure of Encoding Process

Figure 9:
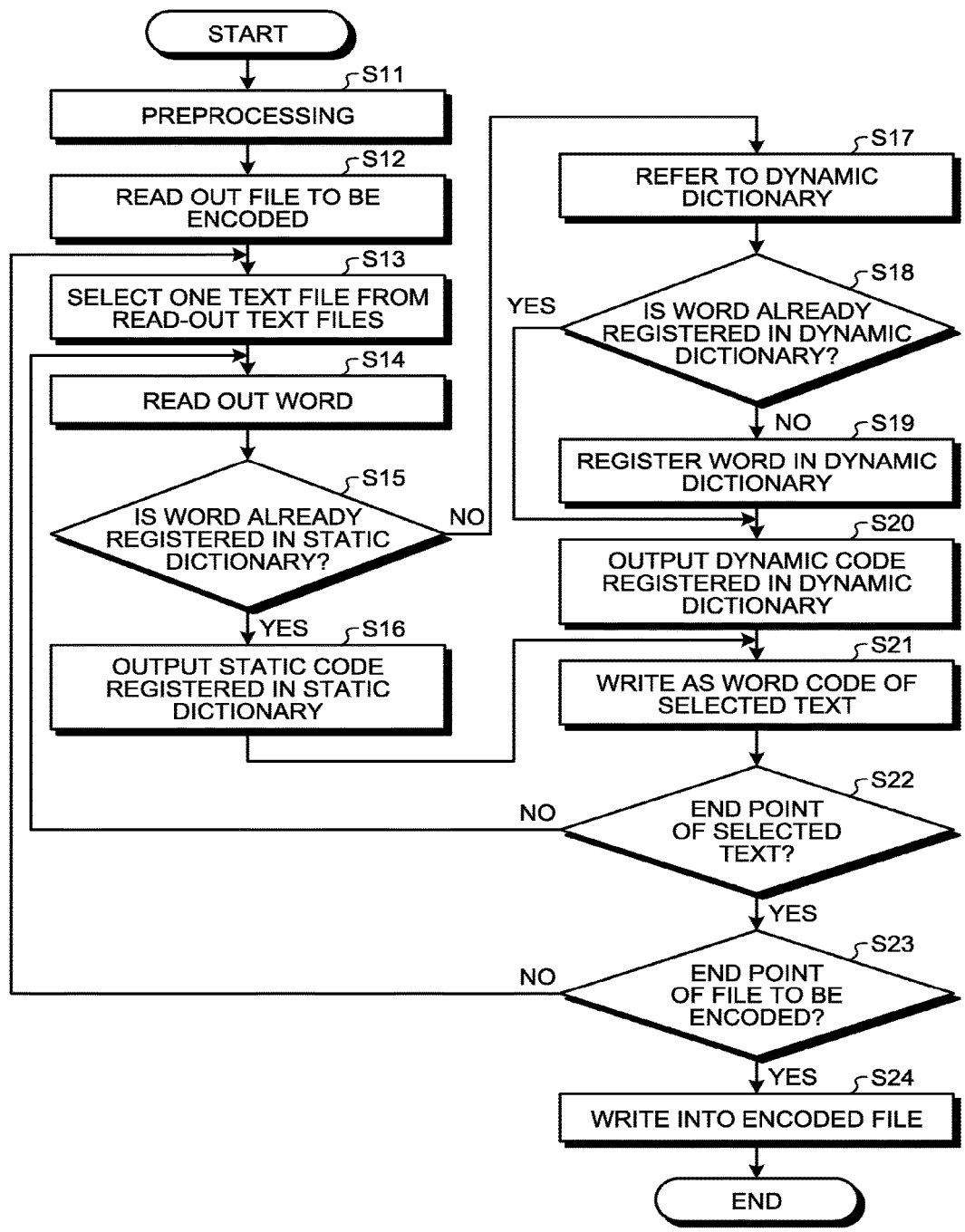
FIG. 9 is a flowchart illustrating one example of the encoding process according to the present embodiment.

Next, a processing procedure of the encoding unit 110 illustrated in FIG. 7 will be explained with reference to FIG. 9. FIG. 9 is a flowchart illustrating one example of the encoding process according to the present embodiment.

As illustrated in FIG. 9, the encoding unit 110 executes preprocessing (Step S11). For example, the encoding unit 110 secures various memory regions in the memory 120. The encoding unit 110 reads out character strings of a plurality of text files in the file F1 to be encoded, and stores the character strings in a memory region for being read out (Step S12).

The encoding unit 110 selects one text file from the read-out plurality of text files (Step S13).

The encoding unit 110 reads out a character string of word of the selected text file from the memory region for being read out (Step S14). For example, the encoding unit 110 executes lexical analysis on the selected text file, and reads out the character strings of words from the head thereof, which are the result of the lexical analysis.

The encoding unit 110 determines whether or not the character string of word is already registered in a static dictionary of the static dictionary unit 121 (Step S15). When determining that the character string of word is already registered in the static dictionary of the static dictionary unit 121 (Step S15: Yes), the encoding unit 110 outputs a static code registered in the static dictionary of the static dictionary unit 121 (Step S16). The encoding unit 110 shifts to Step S21.

On the other hand, when determining that the character string of word is not already registered in the static dictionary of the static dictionary unit 121 (Step S15: No), the encoding unit 110 refers to the dynamic dictionary unit 122 (Step S17). The encoding unit 110 determines whether or not the character string of word is already registered in the dynamic dictionary unit 122 (Step S18). For example, the encoding unit 110 determines whether or not the character string of word is already stored in the buffering unit D1 of the dynamic dictionary unit 122.

When determining that the character string of word is already registered in the dynamic dictionary unit 122 (Step S18: Yes), the encoding unit 110 shifts to Step S20. On the other hand, when determining that the character string of word is not already registered in the dynamic dictionary unit 122 (Step S18: No), the encoding unit 110 registers the character string of word in the dynamic dictionary unit 122 (Step S19). For example, the encoding unit 110 stores the character string of word in the buffering unit D1 of the dynamic dictionary unit 122, and stores a stored position where the character string of word is stored and the length of the stored data in the address table D2. The encoding unit 110 shifts to Step S20.

In Step S20, the encoding unit 110 outputs a dynamic code registered in the dynamic dictionary unit 122 (Step S20). For example, the encoding unit 110 encodes the character string of word into a dynamic code of the address table D2, which are associated with the character string of word. The encoding unit 110 outputs the encoded dynamic code. The encoding unit 110 shifts to Step S21.

In Step S21, the encoding unit 110 stores as word code of the selected text file in the memory region for being written into (Step S21). The encoding unit 110 determines whether or not being at an end point of the selected text file (Step S22). When determining being at the end point of the selected text file (Step S22: No), the encoding unit 110 shifts to Step S14 to read out the next word of the selected text file.

On the other hand, when determining being at the end point of the selected text file (Step S22: Yes), the encoding unit 110 determines whether or not being at the end point of the file to be encoded (Step S23). When determining not being at the end point of the file to be encoded (Step S23: No), the encoding unit 110 shifts to Step S13 to select the next text file.

When determining being at the end point of the file to be encoded (Step S23: Yes), the encoding unit 110 writes the encoded data into the encoded file, which is memorized in the memory region for being written into (Step S24). In this case, the encoding unit 110 writes information on addresses where the text files are stored and the dynamic dictionary unit 122 into a trailer part of the encoded file. The encoding unit 110 terminates the encoding process.

Processing Procedure of Decoding Unit

Figure 10:
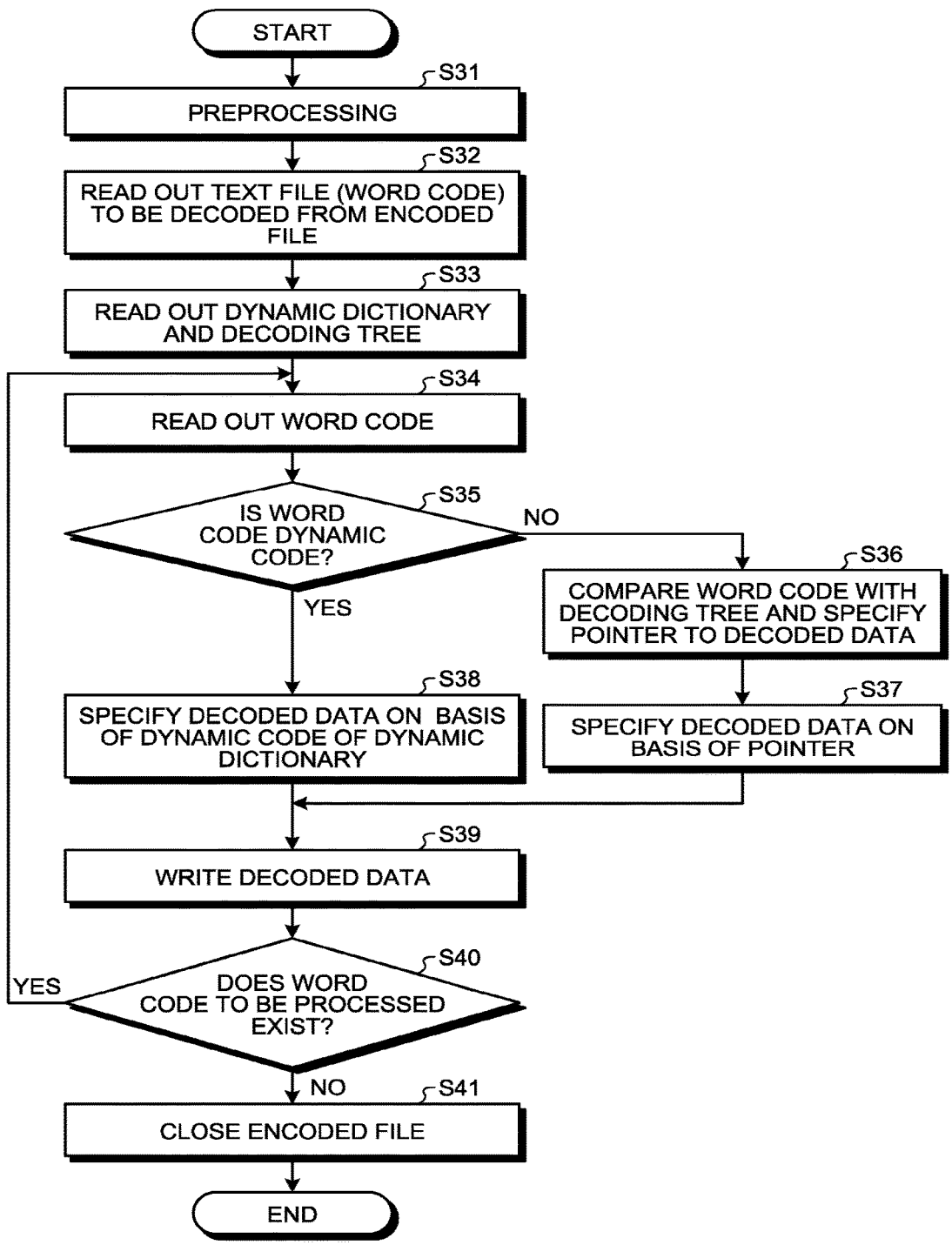
FIG. 10 is a flowchart illustrating one example of the decoding process according to the present embodiment.

Next, a processing procedure of the decoding unit 210 illustrated in FIG. 8 will be explained with reference to FIG. 10. FIG. 10 is a flowchart illustrating one example of the decoding process according to the present embodiment.

As illustrated in FIG. 10, the decoding unit 210 executes preprocessing (Step S31). For example, the decoding unit 210 secures various memory regions in the memory 220. The decoding unit 210 reads out encoded data that is the text file (word code) to be decoded from the encoded file F2 into the memory region for being read out (Step S32), and further reads out the dynamic dictionary D0 and the tree 60 for decoding (Step S33). The dynamic dictionary D0 is stored in the dynamic dictionary unit 222 of the memory 220. The tree 60 for decoding is stored from the memory region for being read out into the decoding tree 223 of the memory 220 from which the word code is read out.

The decoding unit 210 reads out the word code from the memory region for being read out (Step S34). The decoding unit 210 determines whether or not the word code is a dynamic code (Step S35).

When determining that the word code is not a dynamic code (Step S35: No), the decoding unit 210 compares the word code with the decoding tree 223, and specifies a pointer to the decoded data (Step S36). The decoding unit 210 specifies the decoded data on the basis of the pointer to the decoded data (Step S37). The decoding unit 210 shifts to Step S39.

On the other hand, when determining that the word code is a dynamic code (Step S35: Yes), the decoding unit 210 specifies the decoded data on the basis of a dynamic code of the dynamic dictionary unit 222 (Step S38). For example, the decoding unit 210 specifies the dynamic code that coincides with a word code from the address table D2 of the dynamic dictionary unit 222, and acquires a stored position and the data length corresponding to the specified dynamic code. The decoding unit 210 specifies the decoded data according to the data length acquired from the acquired stored position for the buffering unit D1 of the dynamic dictionary unit 222. The decoding unit 210 shifts to Step S39.

In Step S39, the decoding unit 210 writes the decoded data into the memory region for being written into (Step S39). The decoding unit 210 determines whether or not a word code to be processed exists in the memory region for being read out (Step S40). When determining that the word code to be processed exists in the memory region for being read out (Step S40: Yes), the decoding unit 210 shifts to Step S34 to read out the next word code.

On the other hand, when determining that the word code to be processed does not exist in the memory region for being read out (Step S40: No), the decoding unit 210 close the encoded file F2 (Step S41). The decoding unit 210 terminates the decoding process.

Use of Encoding Process

FIG. 11 is a diagram illustrating one example of a use of the encoding process according to the present embodiment. In the case illustrated in FIG. 11, posted texts to a message board and comment sentences thereto are used as a plurality of text files in the file F1 that to be encoded. Herein, the case is assumed that A-san posts "tramping" to the message board, and nine comments are written therein. The posted text of A-san and the nine comment sentences are the text files that are associated with each other. In other words, unknown words such as "Ozegahara", "nikkokisuge", and "Hatomachi-toge" are repeatedly used in each of the text files. Herein, "Ozegahara" is indicated by a code a1, "Hatomachi-toge" is indicated by a code a2, and "nikkokisuge" is indicated by a code a3. The posted text of A-san, a comment of B-san, a comment of C-san, a comment of D-san, a comment of E-san, a comment of F-san, a comment of G-san, a comment of H-san, a comment of I-san, and a comment of A-san correspond to the text files, respectively.

In such a situation, in the encoding process, the posted text having posted to "tramping" and the comment sentences are collectively encoded and stored in the encoded file F2. In the encoded file F2, encoded data of the posted text and the comment sentences are stored in the area of encoded data. In the encoded file F2, addresses where the encoded data of the posted text and the comment sentences are stored, respectively, are stored in addresses of respective files in the trailer part. In the encoded file F2, the shared dynamic dictionary D0 is stored in the trailer part. As an example, " . . . OzegaharaΔHatomachi-togeΔ nikkokisugeΔ . . . " is stored in the buffering unit D1 of the dynamic dictionary D0. In the address table D2 of the dynamic dictionary D0, the stored positions and the data lengths are stored while associating "OzegaharaΔ", "Hatomachi-togeΔ", and "nikkokisugeΔ" with dynamic codes, respectively.

Thereby, by employing the encoding process, the dynamic dictionary D0 that registers a word that is not registered in a static dictionary and repeatedly appears can be shared between a plurality of text files, and thus a compression ratio can be improved.

When a plurality of files is divided by a folder, a common word is included in each file that is subordinate to the folder in some cases. For example, in Twitter (Registered Trademark), tweets are stored in each file subordinate to a folder. An important word included in a text of an utterer becomes a theme, and the word and a word related to the word frequently appear in tweets of the followers. In such a situation, by employing the encoding process, tweets stored in all of the files subordinate to a folder are collectively encoded, and the encoded tweets are stored in the encoded file F2. Thereby, the encoding process can cause the dynamic dictionary D0 in which a repeatedly-appearing word is registered, which is not registered in a static dictionary, to be shared between a plurality of files, a compression ratio can be improved.

Effects of Embodiment

According to the aforementioned embodiment, the encoding device 100 encodes a plurality of input text files to a plurality of encoded files by using the static dictionary unit 121 and the dynamic dictionary unit 122, and the dynamic dictionary unit 122 is generated in accordance with the word appearance frequencies in the plurality of text files. The encoding device 100 generates the coupled encoded file F2 including the plurality of encoded files, information on the dynamic dictionary unit 122, and position information indicating the positions of the respective plurality of encoded files. By employing the configuration, the encoding device 100 can cause the dynamic dictionary unit 122 of the plurality of text files to be shared, and thus a compression ratio can be improved.

According to the aforementioned embodiment, the encoding device 100 stores information on the dynamic dictionary unit 122 and the position information that indicates the positions of the respective plurality of encoded files in a trailer part of the coupled encoded file F2. By employing the configuration, the encoding device 100 collectively stores, in a trailer part, needed information at the time of decoding of the plurality of encoded files, and thus the plurality of encoded files can be effectively decoded.

According to the aforementioned embodiment, the encoding device 100 generates the dynamic dictionary unit 122 in accordance with the word appearance frequencies in text files associated with each other among the plurality of text files, and executes encoding by using the static dictionary unit 121 and the dynamic dictionary unit 122. By employing the configuration, because the possibility that a word that repeatedly appears in the text files exists is high, the encoding device 100 can cause the dynamic dictionary D0 in which a repeatedly-appearing word is registered to be shared between the plurality of text files, and thus a compression ratio can be improved.

According to the aforementioned embodiment, the encoding device 100 generates the dynamic dictionary in accordance with the word appearance frequencies in the plurality of text files in the same folder, and executes encoding by using the static dictionary and the dynamic dictionary. By employing the configuration, because there exists the possibility that a word repeatedly appears in the plurality of text files exists, the encoding device 100 can cause the dynamic dictionary D0 in which a repeatedly-appearing word is registered to be shared between the plurality of text files, and thus a compression ratio can be improved.

According to the aforementioned embodiment, the encoding device 100 generates the dynamic dictionary in accordance with the word appearance frequencies in the text files that have common or associated file-related information therebetween, and executes encoding by using the static dictionary and the dynamic dictionary. By employing the configuration, because the possibility that a word that repeatedly appears in the plurality of text files exists is high, the encoding device 100 can cause the dynamic dictionary D0 in which a repeatedly-appearing word is registered to be shared between the plurality of text files, and thus a compression ratio can be improved.

According to the aforementioned embodiment, the encoding device 100 generates the dynamic dictionary in accordance with the word appearance frequencies in the text files that have a common specific word therebetween, and executes encoding by using the static dictionary and the dynamic dictionary. By employing the configuration, because the possibility that a word that repeatedly appears in the plurality of text files exists is high, the encoding device 100 can cause the dynamic dictionary D0 in which a repeatedly-appearing word is registered to be shared between the plurality of text files, and thus a compression ratio can be improved.

According to the aforementioned embodiment, the encoding device 100 generates the dynamic dictionary in accordance with the word appearance frequencies in the text files having a common specific word whose appearance frequency is equal to or more than a predetermined value, and executes encoding by using the static dictionary and the dynamic dictionary. By employing the configuration, because the possibility that a word that repeatedly appears in the text files exists is high, the encoding device 100 can cause the dynamic dictionary D0 in which a repeatedly-appearing word is registered to be shared between the plurality of text files, and thus a compression ratio can be improved.

Other Embodiment Related to Aforementioned Embodiment

Hereinafter, a part of modifications of the aforementioned embodiment will be explained. Not limited to the following modification, the design may be modified within the range that does not deviate from the main idea of the present disclosure.

The processing procedures, the control procedures, the specific appellations, and the information including various data and parameters, which are described in the embodiment, may be arbitrarily altered except in the case of special note.

Hardware Configuration of Information Processing Apparatus

Figure 12:
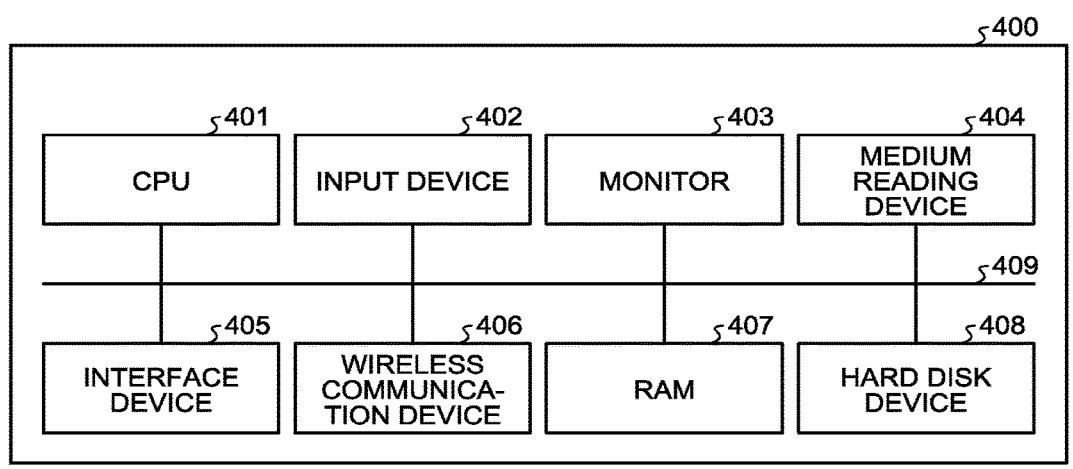
FIG. 12 is a diagram illustrating a hardware configuration of an information processing apparatus according to the embodiment.

A hardware configuration of an information processing apparatus including the encoding device 100 and the decoding device 200 according to the embodiment will be explained with reference to FIG. 12. FIG. 12 is a diagram illustrating a hardware configuration of an information processing apparatus according to the embodiment. As in the example illustrated in FIG. 12 indicating, a computer 400 includes a Central Processing Unit (CPU) 401 that executes various computing processes, an input device 402 that receives a data input from a user, and a monitor 403. The computer 400 further includes a medium reading device 404 that reads a program and the like from a storage medium, an interface device 405 for connecting to another device, and a wireless communication device 406 for wirelessly connecting to another device. The computer 400 further includes a Random Access Memory (RAM) 407 that temporarily stores various kinds of information, and a hard disk device 408. The devices 401 to 408 are connected to a bus 409.

The hard disk device 408 stores an encoding program that has similar functions to those of processing units of, for example, the determination unit 112, the first encoding unit 113, the second encoding unit 114, and the updating unit 115, which are illustrated in FIG. 7. The hard disk device 408 stores various data that realize the encoding program. The hard disk device 408 stores a decoding program that has similar functions to those of processing units of, for example, the determination unit 212, the first decoding unit 213, the second decoding unit 214, and the updating unit 215, which are illustrated in FIG. 8. The hard disk device 408 stores various data that realize the decoding program.

The CPU 401 reads out each of the programs stored in the hard disk device 408 to expand on the RAM 407, and executes the programs to execute various processes. These programs can cause the computer 400 to function as, for example, the determination unit 112, the first encoding unit 113, the second encoding unit 114, and the updating unit 115, which are illustrated in FIG. 7. These programs can cause the computer 400 to function as, for example, the determination unit 212, the first decoding unit 213, the second decoding unit 214, and the updating unit 215, which are illustrated in FIG. 8.

The aforementioned encoding program or the decoding program is not needed to be stored in the hard disk device 408. For example, the computer 400 may read out and execute a program stored in a storage medium that can be read by the computer 400. The storage medium that can be read by the computer 400 corresponds to, for example, a portable storage medium such as a Compact Disk Read-Only-Memory (CD-ROM) and a Universal Serial Bus memory (USB memory), a semiconductor memory such as a Flash memory, a hard disk drive, etc. The program may be stored in a device connected to the public line, the Internet, a Local Area Network (LAN), etc., and the computer 400 may read out the program from the device to execute.

Figure 13:
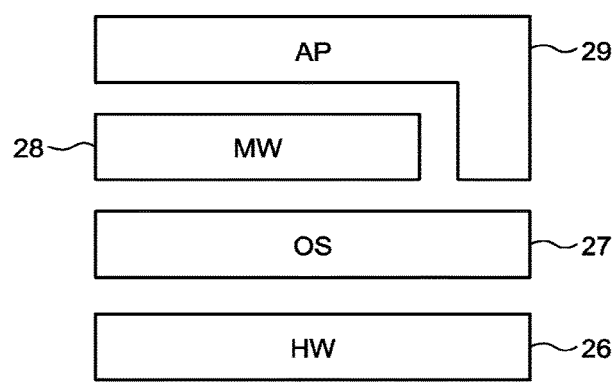
FIG. 13 is a diagram illustrating a configuration example of a program that operates in a computer.

FIG. 13 is a diagram illustrating a configuration example of a program that operates in a computer. In the computer 400, an operating system (OS) 27 operates, which executes the control of a hardware group 26 (401 to 409) illustrated in FIG. 13. The CPU 401 operates in a procedure according to the OS 27 to control/manage the hardware group 26, and thus a process according to an application program 29 or a middleware 28 is executed in the hardware group 26. Moreover, in the computer 400, the middleware 28 and the application program 29 is read out by the RAM 407 to be executed by the CPU 401.

In a case where a word to be encoded is received by the CPU 401, processes is executed on the basis of at least a part of the middleware 28 or the application program 29, and thus (execute those processes by controlling the hardware group 26 on the basis of the OS 27) an encoding function of the encoding unit 110 is realized. The encoding function may be included in each of the application program 29, or may be a part of the middleware 28 that is called in accordance with the application program 29 to be executed.

As described above, according to an aspect of the embodiment, a compression ratio is improved even when a plurality of files exists in document data to be compressed.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A non-transitory computer-readable recording medium having stored therein an encoding program that causes a computer to execute a process comprising:
encoding a plurality of text files that are input to the computer to a plurality of encoded files by using a static dictionary and a dynamic dictionary, the dynamic dictionary being generated in accordance with word appearance frequencies in the plurality of text files; and
generating a coupled encoded file that includes the plurality of encoded files, information on the dynamic dictionary, and position information that indicates a position of each of the plurality of encoded files.

2. The non-transitory computer-readable recording medium according to claim 1, wherein the generating includes storing the information on the dynamic dictionary and the position information in a trailer part of the coupled encoded file.

3. The non-transitory computer-readable recording medium according to claim 1, wherein the encoding includes generating the dynamic dictionary in accordance with word appearance frequencies in text files associated with each other among the plurality of text files, and executing encoding by using the static dictionary and the dynamic dictionary.

4. The non-transitory computer-readable recording medium according to claim 3, wherein the text files associated with each other are in a same folder.

5. The non-transitory computer-readable recording medium according to claim 3, wherein the text files associated with each other have common or associated file-related information therebetween.

6. The non-transitory computer-readable recording medium according to claim 3, wherein the text files associated with each other have a common specific word therebetween.

7. The non-transitory computer-readable recording medium according to claim 3, wherein the text files associated with each other have a common specific word whose appearance frequency is equal to or more than a predetermined value.

8. An encoding device comprising:
a processor, wherein the processor executes:
encoding a plurality of text files that are input to the encoding device to a plurality of encoded files by using a static dictionary and a dynamic dictionary, the dynamic dictionary being generated in accordance with word appearance frequencies in the plurality of text files; and
generating a coupled encoded file that includes the plurality of encoded files, information on the dynamic dictionary, and position information that indicates a position of each of the plurality of encoded files.

9. An encoding method executed by a computer, the method comprising:

encoding a plurality of text files that are input to the computer to a plurality of encoded files by using a static dictionary and a dynamic dictionary, the dynamic dictionary being generated in accordance with word appearance frequencies in the plurality of text files using a processor; and generating a coupled encoded file that includes the plurality of encoded files, information on the dynamic dictionary, and position information that indicates a position of each of the plurality of encoded files using the processor.

10. A non-transitory computer-readable recording medium having stored therein a decoding program that causes a computer to execute a process, the process comprising:

extracting an encoded file to be decoded from a coupled encoded file, which includes a plurality of encoded files, information on a dynamic dictionary generated in accordance with word appearance frequencies, and position information indicating a position of each of the plurality of encoded files, based on the position information; and decoding the extracted encoded file by using the dynamic dictionary and a static dictionary.

11. A decoding device comprising:

a processor, wherein the processor executes:

extracting an encoded file to be decoded from a coupled encoded file, which includes a plurality of encoded files, information on a dynamic dictionary generated in accordance with word appearance frequencies, and position information indicating a position of each of the plurality of encoded files, based on the position information; and decoding the extracted encoded file by using the dynamic dictionary and a static dictionary.

12. An decoding method executed by a computer, the method comprising:

extracting an encoded file to be decoded from a coupled encoded file, which includes a plurality of encoded files, information on a dynamic dictionary generated in accordance with word appearance frequencies, and position information indicating a position of each of the plurality of encoded files, based on the position information using a processor; and decoding the extracted encoded file by using the dynamic dictionary and a static dictionary using the processor.

13. The non-transitory computer-readable recording medium according to claim 1, wherein the generating includes generating a coupled encoded file that includes the plurality of encoded files, and storing the information on the dynamic dictionary and the position information in a trailer part of the coupled encoded file.

14. The non-transitory computer-readable recording medium according to claim 1, wherein the encoding includes encoding a plurality of text files that are input to the computer and are associated with each other to a plurality of encoded files by using a static dictionary and a dynamic dictionary, the dynamic dictionary being generated in accordance with word appearance frequencies in the plurality of text files.

* * * * *